United States Patent [19]

Terauchi

[11] Patent Number: 5,798,629

[45] Date of Patent: Aug. 25, 1998

[54] APPARATUS FOR DIAGNOSING LOW VOLTAGE BATTERY

[75] Inventor: Kenji Terauchi, Isehara, Japan

[73] Assignee: Nissan Motor Co., Ltd., Yokohama, Japan

[21] Appl. No.: 659,178

[22] Filed: Jun. 6, 1996

[30] Foreign Application Priority Data

Jun. 7, 1995 [JP] Japan .................. 7-140557

[51] Int. Cl.$^6$ .................................................. H02J 7/00
[52] U.S. Cl. ........................... 320/15; 320/39; 320/48
[58] Field of Search ............................ 320/15, 32, 39, 320/48, 35

[56] References Cited

U.S. PATENT DOCUMENTS

| | | | |
|---|---|---|---|
| 4,990,885 | 2/1991 | Irick et al. | 340/455 |
| 5,033,565 | 7/1991 | Abukawa et al. | 180/79.1 |
| 5,334,926 | 8/1994 | Imaizumi | 320/15 |
| 5,350,994 | 9/1994 | Kinoshita et al. | 320/15 |

FOREIGN PATENT DOCUMENTS 7-107602.  4/1995  Japan .

Primary Examiner—Peter S. Wong
Assistant Examiner—Patrick B. Law
Attorney, Agent, or Firm—Foley & Lardner

[57] ABSTRACT

An apparatus for diagnosing a low voltage battery includes a high voltage battery for powering an electric automobile, a voltage converter that reduces the output of the high voltage battery to a low voltage, a low voltage battery for powering the auxiliaries of the automobile, a current/voltage sensor, a controller, and a warning indicator. The low voltage battery is connected to the high voltage battery through the voltage convertor and a resistor is connected to the low voltage battery. The current/voltage sensor detects electric currents and voltages of the low voltage battery and the resistor. The controller diagnoses the degradation of the low voltage battery at the start of operation of the automobile by referring the output of the current/voltage sensor to a set of selected predetermined reference values. A battery relay interrupts the connection between the high voltage battery and the low voltage battery to diagnose the low voltage battery and the warning indicator alerts to a degradation of the low voltage battery.

16 Claims, 9 Drawing Sheets

APPARATUS FOR DIAGNOSING LOW VOLTAGE BATTERY

BACKGROUND OF THE INVENTION

1. Field of the Invention

This invention relates to an apparatus for diagnosing and detecting degradation of a low voltage battery for powering the auxiliaries of an electric automobile.

2. Prior Art

Known technologies in the above identified field include the one disclose in Japanese Patent Application Laid-Open No. 7-107602. It describes an apparatus for electrically charging a supplementary battery of an electric automobile. The apparatus comprises a main battery, a DC-DC converter, a supplementary battery, vehicle auxiliaries and switches. The DC-DC converter comprises, as major components thereof, a transformer, a rectifying circuit, transistors, an insulated transformer and a control circuit to which a battery for the auxiliaries is connected by way of a switch to apply a voltage to the control circuit.

The object of the invention of an apparatus for electrically charging a supplementary battery of an electric automobile described in the above patent document is to eliminate the necessity of arranging an additional DC-DC converter in order to provide a control power source for the existing DC-DC converter.

The above described supplementary battery, or a low voltage battery, is used for supplying electric power to the motor for driving the pump of the electric power steering system and the head lamp. Thus, so long as the drive current of the motor does not exceed the output of the DC-DC converter, the electric current running through the motor entirely comes from the DC-DC converter.

However, if a large electric current flows through the motor as a result of turning the steering wheel, the drive current exceeds the output of the DC-DC converter and the low voltage battery is forced to also supply power to the motor in order to fill the shortage and, as a result, the voltage of the low voltage battery falls extremely so that the head lamps may remarkably lose the brightness to make the driver uncomfortable. With a gasoline-powered automobile, if the battery of the automobile is out, the starter motor cannot ignite the engine and the driver realizes the inoperative condition of the battery, however, with an electric automobile that is not provided with such a starter motor, the driver typically does not realize the inoperative condition of the battery until the brightness of the head lamps and/or some other lamp of the automobile fluctuates a while after starting and maneuvering the automobile, when it is too late to remedy the totally degraded condition of the battery.

SUMMARY OF THE INVENTION

The object of the present invention is to provide an apparatus capable of diagnosing and detecting degradation of a low voltage battery at starting.

According to the invention, the above object is achieved by providing an apparatus for diagnosing a low voltage battery, comprising: a high voltage battery for powering an electric automobile; a voltage reducing means for reducing the output of the high voltage battery to a low voltage; a low voltage battery for powering the auxiliaries of the automobile, the low voltage battery being connected to said high voltage battery by way of the voltage reducing means; a resistor means to be connected to the low voltage battery; a current/voltage sensing means for detecting the electric current and the voltage of the low voltage battery and resistor means; a battery diagnosing means for diagnosing the low voltage battery at the start of operation by referring to the output of the current/voltage sensor and a set of selected predetermined reference values for diagnosis; a battery switching means for interrupting the connection between the high voltage battery and the low voltage battery for the battery diagnosing means to diagnose; and a warning means operating according to the result of operation of the battery diagnosing means.

With an apparatus for diagnosing a low voltage battery according to the invention, the battery switching means interrupts the connection between the high voltage battery and the low voltage battery when the apparatus starts operating. Under this condition, the current and the voltage detected by the current/voltage sensor shows a constant relationship because of the resistor means connected to the low voltage battery. Thus, the state of the low voltage battery can be diagnosed at the very start of the operation of the automobile by means of the apparatus for diagnosing a low voltage battery according to the invention on the basis of the above relationship and a set of predetermined and stored reference values. If the detected state of the low voltage battery is not normal, the warning means operates to notify the driver that the low voltage battery is not normal.

Preferably, the internal resistance of a motor for driving a pump of the electric power steering system is used for the resistor means; and a pressure generating means is provided to generate a predetermined hydraulic pressure, when the battery diagnosing means diagnoses the low voltage battery, in the pump hydraulic circuit of the electric power steering system.

With this arrangement, when the battery diagnosing means diagnoses the low voltage battery, utilizing the electric power steering system, a predetermined hydraulic pressure is generated in the pump hydraulic circuit of the electric power steering system to drive the motor under a predetermined load so that the electric current and the voltage detected by the current/voltage sensor shows a constant relationship. Thus, the battery diagnosing means diagnoses the low voltage battery by referring to a set of predetermined reference values provided by the constant relationship.

Preferably, the resistor means is a resistor; and a resistor interrupting means is provided, and connects the low voltage battery with the resistor to establish a circuit only when said battery diagnosing means diagnoses the low voltage battery.

With the above arrangement, since the resistor interrupting means connects the low voltage battery with the resistor only when the battery diagnosing means diagnoses the low voltage battery, the electric current and the voltage detected by the current/voltage sensor shows a constant relationship and the battery diagnosing means diagnoses the low voltage battery by referring to a set of predetermined reference values provided by the constant relationship.

Preferably, the battery diagnosing means diagnoses the low voltage battery according to an ON signal of the ignition switch of the automobile.

With this arrangement, the battery diagnosing means diagnoses the low voltage battery according to an ON signal of the ignition switch or immediately after the automobile starts operating.

Preferably, a temperature sensor is provided to detect the temperature of the low voltage battery; and the battery diagnosing means stores a plurality of sets of reference values to be selected depending on the temperature of the low voltage battery and diagnoses the low voltage battery by referring to the set of reference values selected for the detected temperature.

With the above arrangement, the temperature sensor detects the temperature of the low voltage battery. The battery diagnosing means selects a set of reference values depending on the detected temperature of the low voltage battery and diagnoses the low voltage battery.

Preferably, the warning means is a warning light.

With this arrangement, the warning light warns any undesirably degraded or discharged state of the low voltage battery.

The nature, principle and utility of the invention will become more apparent from the following detailed description when read in conjunction with the accompanying drawings.

DESCRIPTION OF THE PREFERRED EMBODIMENTS

Now, the present invention will be described by referring to the accompanying drawings that illustrate preferred embodiments of the invention.

1st Embodiment

Figure 1:
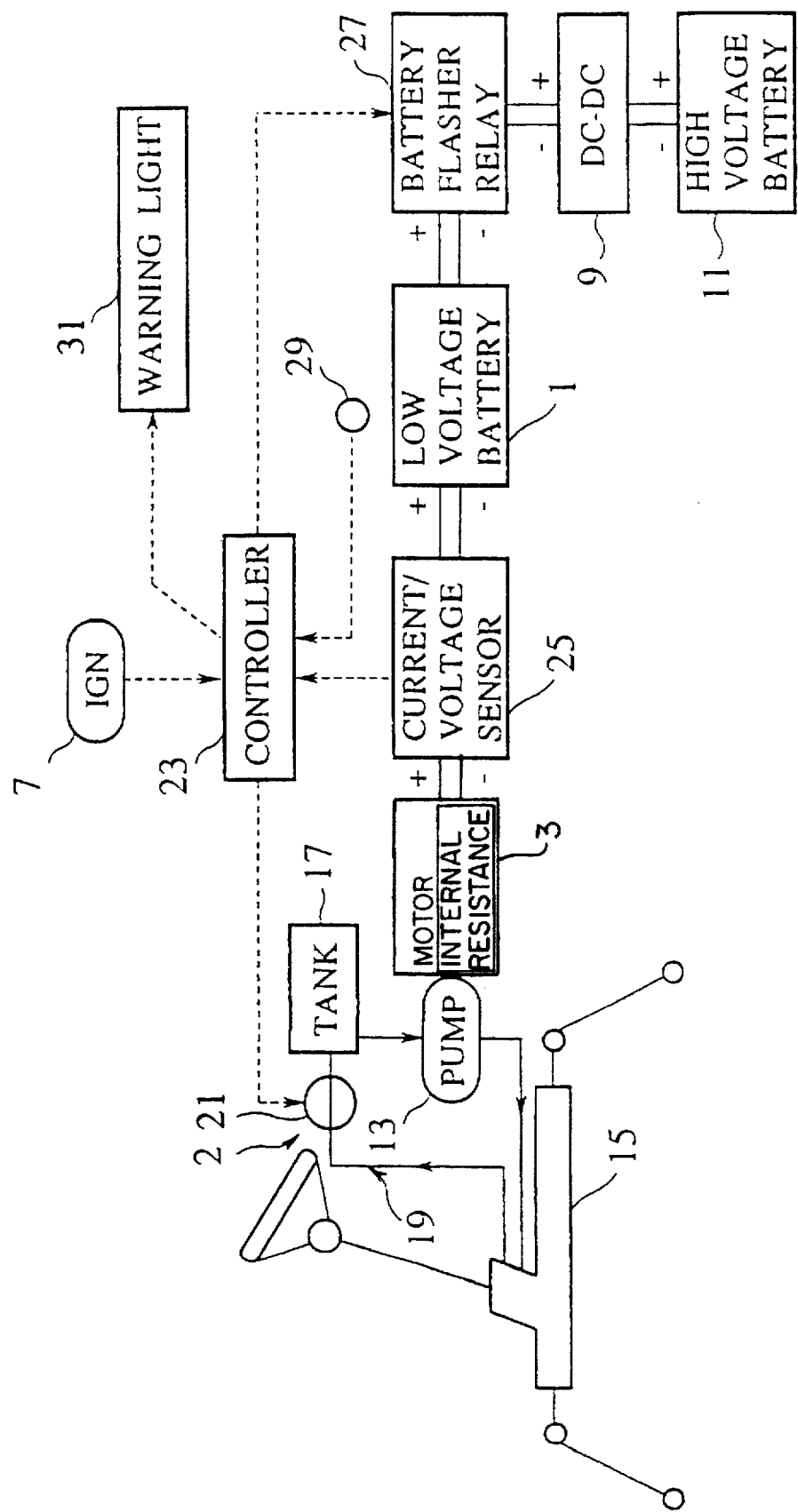
FIG. 1 is a block diagram of a first embodiment of the invention.

FIG. 1 is a block diagram of a first embodiment of the invention, showing it overall configuration.

Conventionally, an ON-signal from the ignition switch is directly applied to the relay and the signal immediately causes the high voltage battery immediately to charge the low voltage battery with electricity by way of the DC-DC converter by the signal.

With this first embodiment, the battery is diagnosed at the start of operation of an electric automobile by utilizing the electric power steering system 2. More specifically, the internal resistance of a motor 3 of the electric power steering system 2 is utilized. The motor 3 is designed to drive a hydraulic pump 13 (of a constant flow rate type) of the electric power steering system 2, which hydraulic pump 13 operates for a pump hydraulic circuit 19 connecting a reservoir tank 17 and a power steering gear. A solenoid valve 21 is also arranged on the pump hydraulic circuit 19 and controlled by a controller 23.

The hydraulic pump 13 is also provided with a relief circuit so that, when the hydraulic pressure of the pump hydraulic circuit 19 rises above a predetermined level (relief pressure), the actuator oil is partly diverted to pass through the relief circuit in order to maintain the hydraulic pressure of the pump hydraulic circuit 19 under the relief pressure. The hydraulic pump 13 and the solenoid valve 21 constitute a pressure generating means.

The electric circuit connecting the motor 3 and the low voltage battery 1 is provided with a current/voltage sensor 25 whose output is fed to said controller 23. The controller 23 is provided with a feature of detecting a discharged and degraded state of the low voltage battery 1 by referring to a set of predetermined reference values it stores. Thus, the controller 23 of this embodiment operates as a battery diagnosing means.

A battery flasher relay 27 is arranged between said low voltage battery 1 and said high voltage battery 11, more specifically between the low voltage battery 1 and the DC-DC converter 9. The battery flasher relay 27 operates to interrupt the connection between the high voltage battery 11 and the low voltage battery 1 according to the signal supplied by the controller 23.

The low voltage battery 1 is provided with a temperature sensor 29. The output signal of the temperature sensor 29 is supplied to the controller 23, which determines the state of the low voltage battery 1 by referring to a set of reference values selected according to the temperature changes detected by the temperature sensor 29.

The controller 23 is fed with signals transmitted from the ignition switch 7 and is connected to a warning light 31.

Figure 2:
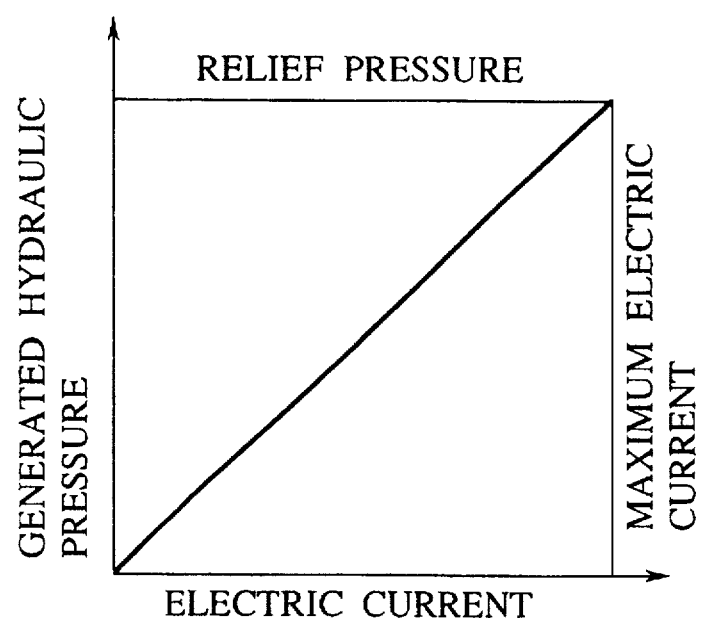
FIG. 2 is a graph showing the relationship between the relief pressure and the electric current of the first embodiment.

The operation of the solenoid valve 21 and the electric current flowing through the motor 3 of this embodiment have a relationship as illustrated in FIG. 2. When the solenoid valve 21 is closed, the pressure of the discharge side of the pump 13 is raised to maximize the load of the pump 13 that corresponds to the relief pressure so that consequently the intensity of the electric current flowing through the motor 3 is maximized in order to drive the pump 13 properly under the load.

Figure 3:
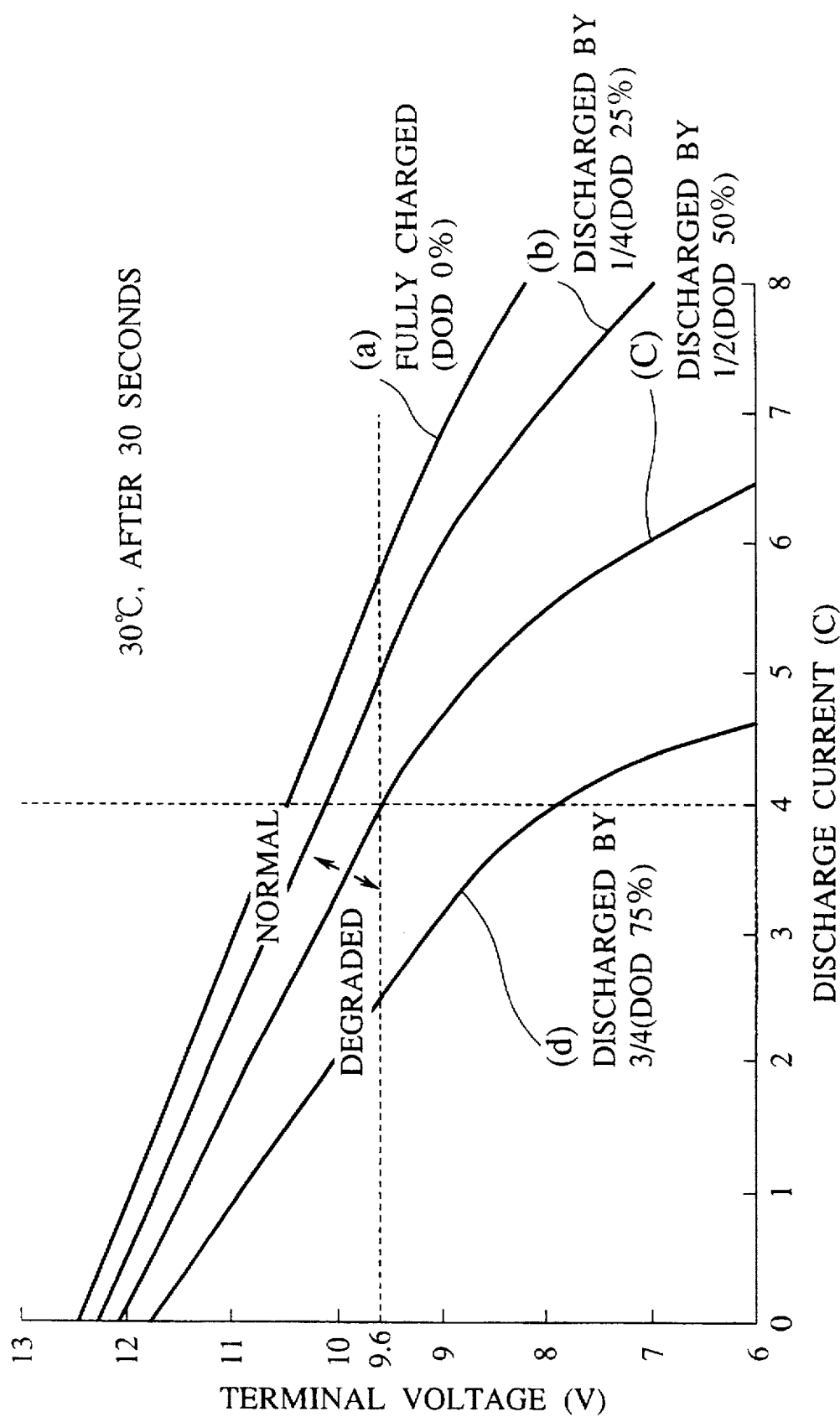
FIG. 3 is a graph showing the reference values of the first embodiment when the temperature of the low voltage battery is 30° C.
Figure 4:
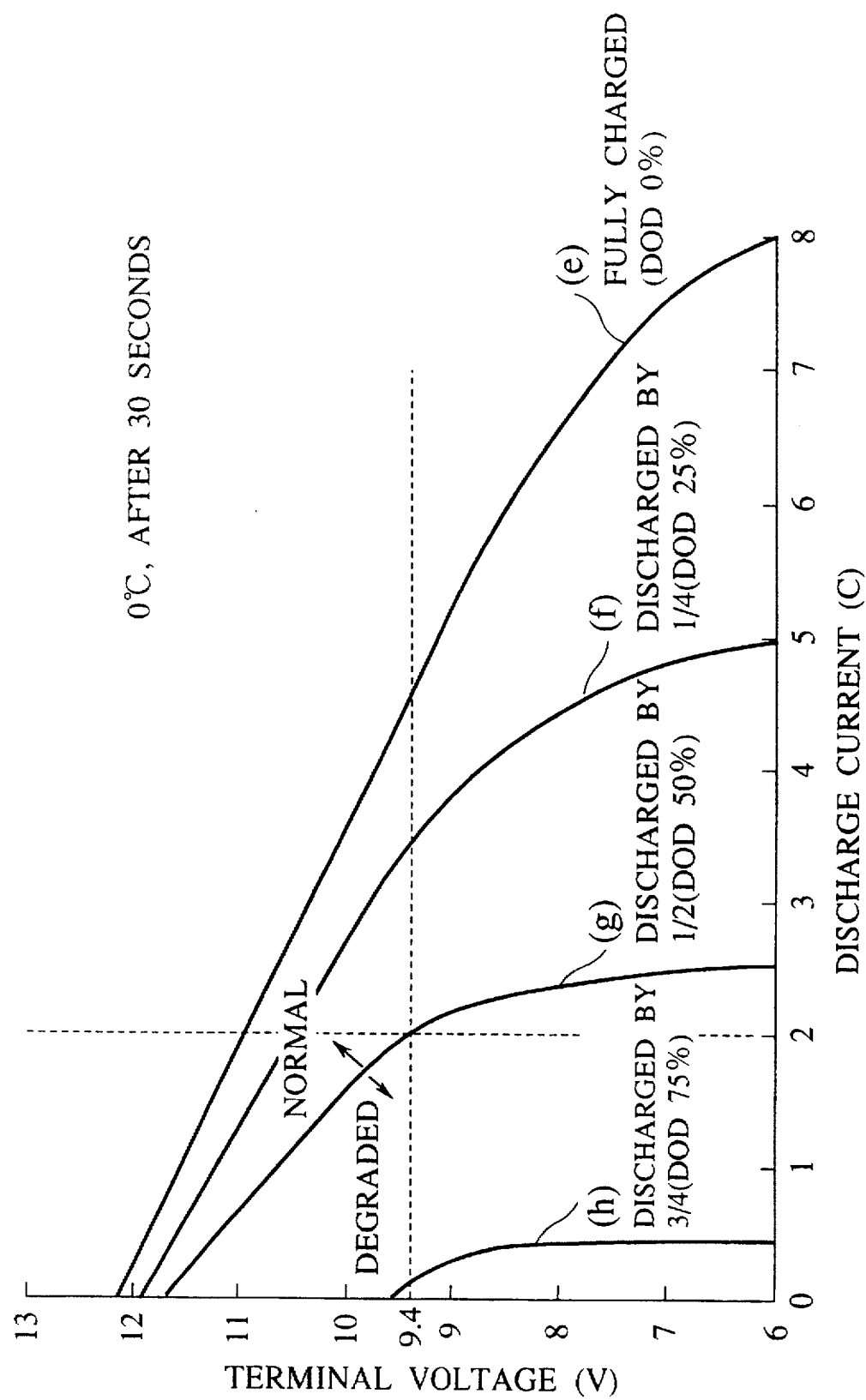
FIG. 4 is a graph showing the reference values of the first embodiment when the temperature of the low voltage battery is 0° C.

FIGS. 3 and 4 are graphs showing two different relationship between the terminal voltage and the discharged current of the low voltage battery 1, of which the graph of FIG. 3 illustrates the performance of the low voltage battery at 30° C. whereas that of FIG. 4 shows the performance of the battery at 0° C. In FIGS. 3 and 4, the ordinate axis represents the terminal voltage (V) of the motor 3 applied by the battery and the transverse axis represents the discharge current (C) of the battery. The unit of the discharge current, or 1C, in the graphs is 20 amperes.

When a large electric current flows through the motor 3, the voltage dramatically drops. The voltage drops even more dramatically when the low voltage battery has been degraded or it has mostly discharged electricity. Of the lines (a), (b), (c) and (d) in FIG. 3 and the lines (e), (f), (g) and (h) in FIG. 4, (a) and (e) show the performance of the battery when it is fully charged (DOD 0%) and (b) and (f) show how the battery operates when ¼ of the electric charge has been discharged (DOD 25%), whereas (c) and (g) and (d) and (h) show the performance of the battery when the electric charge has been consumed by ½ and ¾ respectively. It may be understood that, while only four lines (e), (f), (g) and (h) are shown in FIG. 4, many more lines can be drawn as a function of the discharged state of the battery. If it is so arranged that the controller determines that the battery has been degraded when the DOD falls under 50%, the controller 23 stores the values on the lines (c) and (d) for DOD 50% of the battery as the reference values for judging if the battery has been in a degraded and excessively discharged state or in a normal state.

Assume now that the temperature of the low voltage battery 1 is 30° C. and an intensity of electric current of 4(C) is detected by the current/voltage sensor 25, the controller 23 so determines that the battery 1 is normal if the detected voltage exceeds 9.6V or the value for the electric current of 4(C) on the DOD 50% line of FIG. 3 and it has been degraded if the detected voltage is short of 9.6V. Like wise, when the temperature of the low voltage battery 1 is 0° C. and an intensity of 2(C) is detected by the current/voltage sensor 25, the controller so determines that the battery 1 is normal if the detected voltage exceeds 9.4V or the value for the electric current of 2(C) on the DOD 50% line of FIG. 4 and it has been degraded if the detected voltage is short of 9.4V.

Now, the operation of the embodiment of FIG. 1 will be described by referring to the flow chart of FIG. 5.

At the start of operation, an ON signal is supplied to the controller 23 from the ignition switch 7 and the operation proceeds along the flow chart. Firstly, at step S1, the battery flasher relay 27 is turned off by a signal from the controller 23 to interrupt the connection between the low voltage battery 1 and the high voltage battery 11 and close the solenoid valve 21 of the pump hydraulic circuit 19. Consequently, the hydraulic pump 13 of the pump hydraulic circuit 19 is driven to operate under a loaded condition and an electric current is made to run through the motor 3 with a maximum intensity.

Then, at step S2, the electric current and the voltage are detected and the signal representing the detected electric current and the voltage is fed to the controller 23.

At step S3, the temperature of the battery is detected and the signal representing the detected temperature is also fed to the controller 23.

At step S4, a set of reference values are selected according to the detected temperature of the low voltage battery 1. While the reference values for 30° C. and those for 0° C. are shown in FIGS. 3 and 4 respectively, additional sets of reference values can be stored in the controller 23 for different temperatures.

AT step S5, the state of battery is judged by the controller 23, which compares the voltage detected at step S2 and the reference voltage value. If the temperature of the low voltage battery 1 is 30° C., the DOD 50% line in FIG. 3 provides the reference values. More specifically, if the electric current detected at step 2 is 4(C) and the voltage detected also at step 2 exceeds 9.6V, the controller 23 determines that the low voltage battery 1 is operating normally and proceeds to step S7. If, on the other hand, the electric current detected at step S2 is 4(C) and the voltage detected also at step S2 falls short of 9.6V, the controller 23 determines that the low voltage battery 1 has been discharged and degraded and proceeds to step S6. Likewise, if the temperature of the low voltage battery 1 is 0° C., the DOD 50% in FIG. 4 provides the reference values and, if the controller 23 judges if the low voltage battery 1 is normal or has been discharged and degraded. As in the case of 30° C., the controller 23 proceeds to step S7 if it determines that the low voltage battery 1 is normal, whereas it proceeds to step S6 if it determines that the low voltage battery 1 has been discharged and degraded.

At step S6, a warning is executed as a warning signal is transmitted from the controller 23 to the warning light 31. If the warning light 31 is turned on, the driver can recognize that the low voltage battery 1 has been discharged and degraded at the very beginning of his or her driving operation.

At step S7, the battery flasher relay 27 and the solenoid valve 21 are controlled for operation. More specifically, the controller 23 transmits a signal to open the solenoid valve 21 and turn on the battery flasher relay 27 to connect the low voltage battery 1 and the high voltage battery 11 and bring the pump hydraulic circuit 19 of the electric power steering system 2 back into its normal operating state. The drive motor is powered to run by the high voltage battery 11 and the low voltage battery 1 is electrically charged by way of the DC-DC converter 9. As the motor 3 is powered, the electric power steering system 2 can be operated properly.

Thus, the controller 23 can determine if the low voltage battery 1 has been degraded or not on the basis of the signal from the current/voltage sensor by referring to the reference values selected as a function of the temperature of the low voltage battery 1. Therefore, the driver of the automobile does not have to start without knowing the degraded state of the low voltage battery 1 to experience the uncomfortable feeling of seeing the brightness of the head lamps fluctuates, while maneuvering the automobile. Additionally, the judgment of the controller 23 is correct and accurate because it takes the temperature of the low voltage battery 1 into consideration. Finally, since the motor 3 of the electric power steering system 2 is utilized as a resistor means, the embodiment has a simple configuration and can be realized at low cost.

2nd Embodiment

Figure 6:
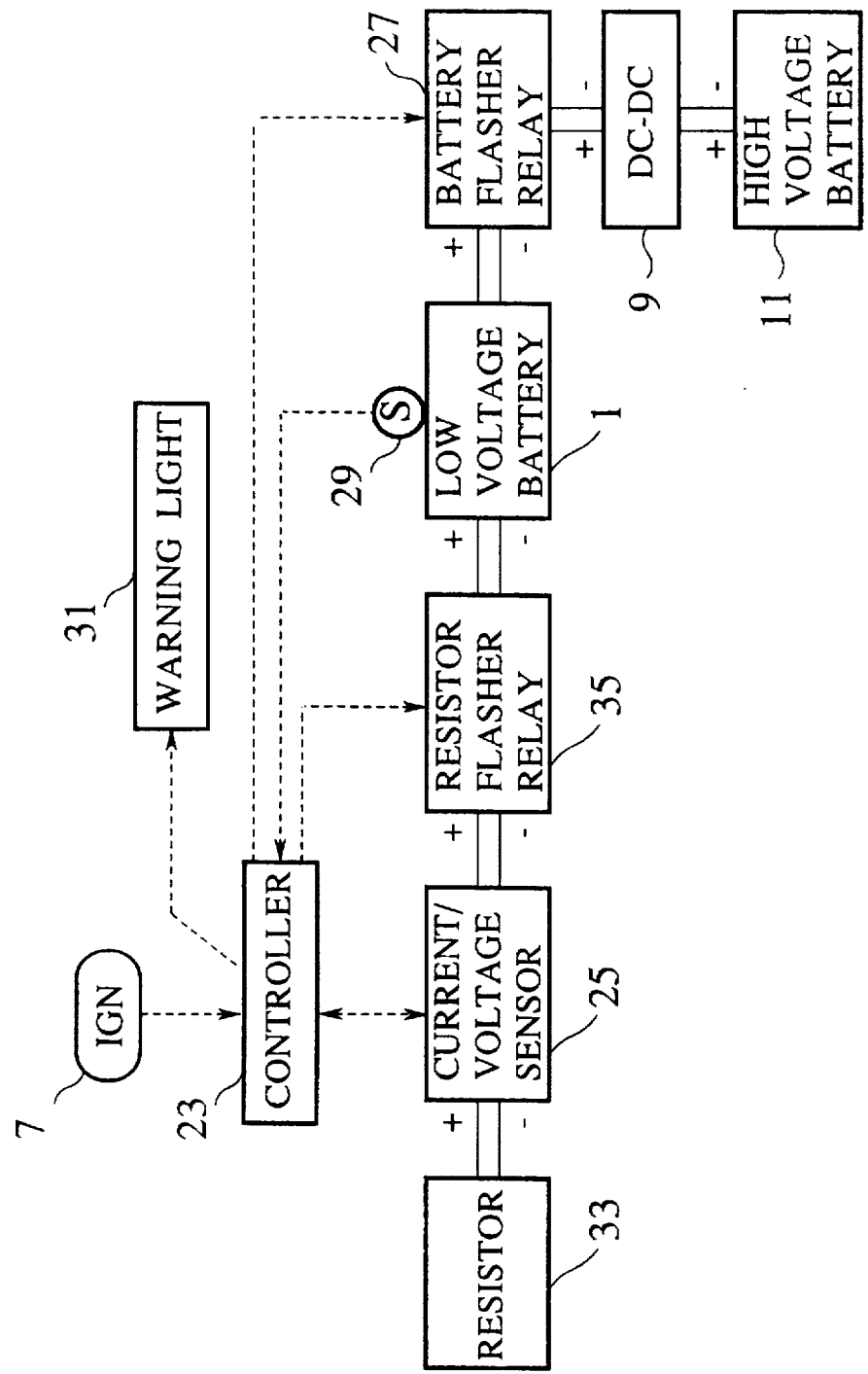
FIG. 6 is a block diagram of a second embodiment of the invention.

FIG. 6 shows a second embodiment of the invention. The components that are same or similar to those of the first embodiment are respectively denoted by the same reference symbols and will not be described here. In this embodiment, the resistor means is a specifically provided resistor 33. A resistor flasher relay 35 is arranged as resistor switching means between the low voltage battery 1 and the current/voltage sensor 25. The resistor flasher relay 35 is turned on and off according to the signal from the controller 23.

Figure 7:
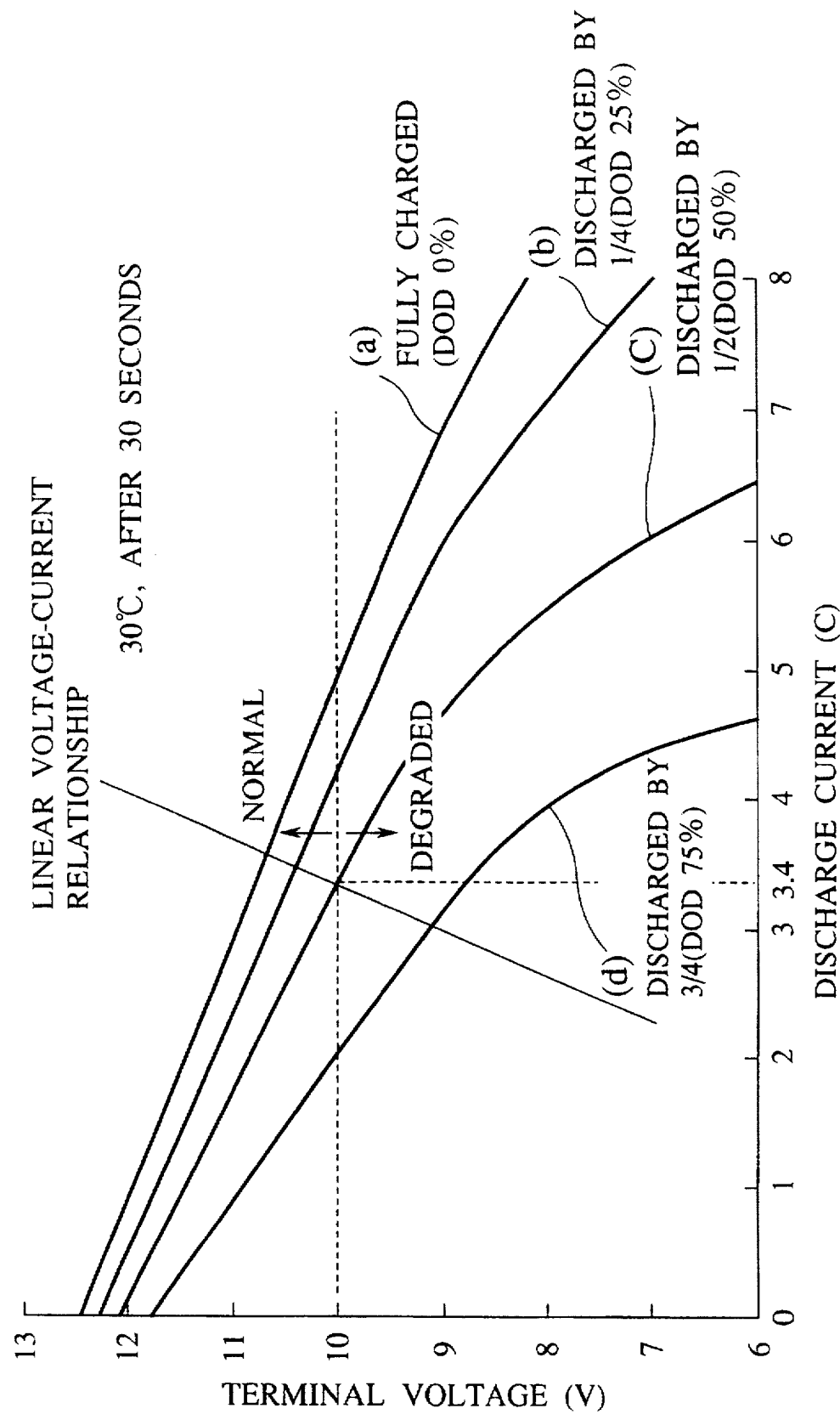
FIG. 7 is a graph showing the reference values of the second embodiment when the temperature of the low voltage battery is 30° C.
Figure 8:
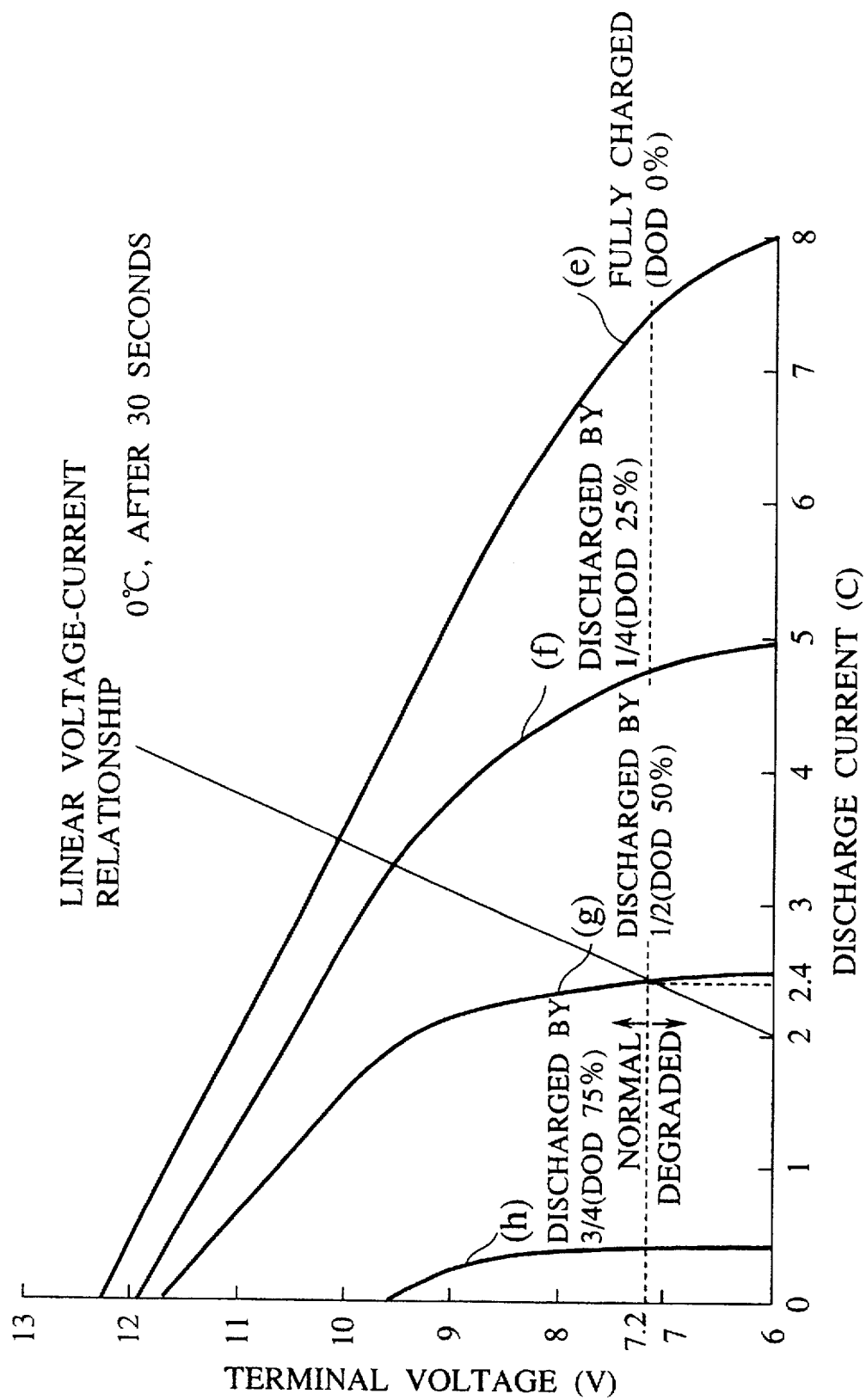
FIG. 8 is a graph showing the reference values of the second embodiment when the temperature of the low voltage battery is 0° C.

FIGS. 7 and 8 are graphs showing two different relationship between the terminal voltage and the discharged current of the low voltage battery 1, which provide reference values. In this embodiment, since the resistor 33 has a fixed resistance, the relationship between the electric current and the voltage is defined by equation $V=I \cdot R$, where V is the voltage, I is the electric current and R is the resistance and shown by inclined straight lines in FIGS. 7 and 8. Thus, in FIG. 7, each of the intersections of the straight line and the lines (a), (b), (c) and (d) represents intensity of electric current and the voltage of the resistor R for the corresponding state of the low voltage battery 1 at 30° C. and, in FIG. 8, each of the intersections of the straight line and the lines (e), (f), (g) and (h) represents intensity of electric current and the voltage of the resistor R for the corresponding state of the low voltage battery 1 at 0° C. As seen from FIG. 7, when the temperature of the low voltage battery 1 is 30° C. and has been discharged by ½ (DOD 50%), the voltage and the intensity of electric current of the resistor R are respectively 10V and 3.4C. The voltage and the electric current will be greater than 10V and 3.4C respectively if the degree of degradation of the low voltage battery 1 is less than this level, whereas they will be smaller than 10V and 3.4C respectively if the degree of degradation exceeds this level. The controller 23 determines that the low voltage battery 1 is normal if the detected voltage is higher than 10V at the temperature of 30° C. and it has been degraded if the detected voltage is short of 10V at that temperature. Likewise, when the temperature of the low voltage battery 1 is 0° C., the controller 23 determines that the low voltage battery 1 is operating normally if the detected voltage exceeds 7.2V and it has been degraded if the voltage falls short of 7.2V on the basis of the intersection of the electric current-voltage line and the curved line (g).

Figure 5:
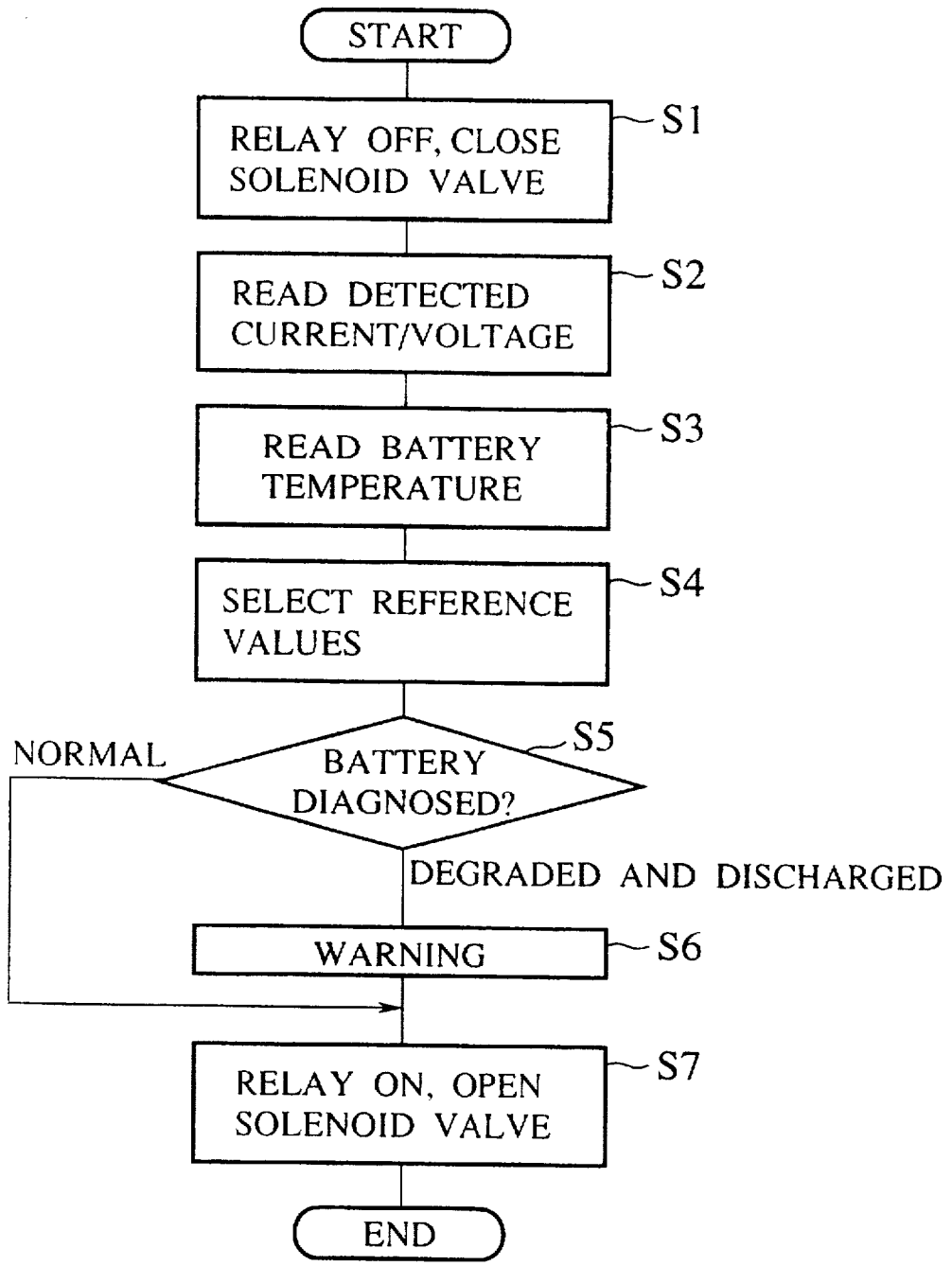
FIG. 5 is a flow chart of the operation of the first embodiment.
Figure 9:
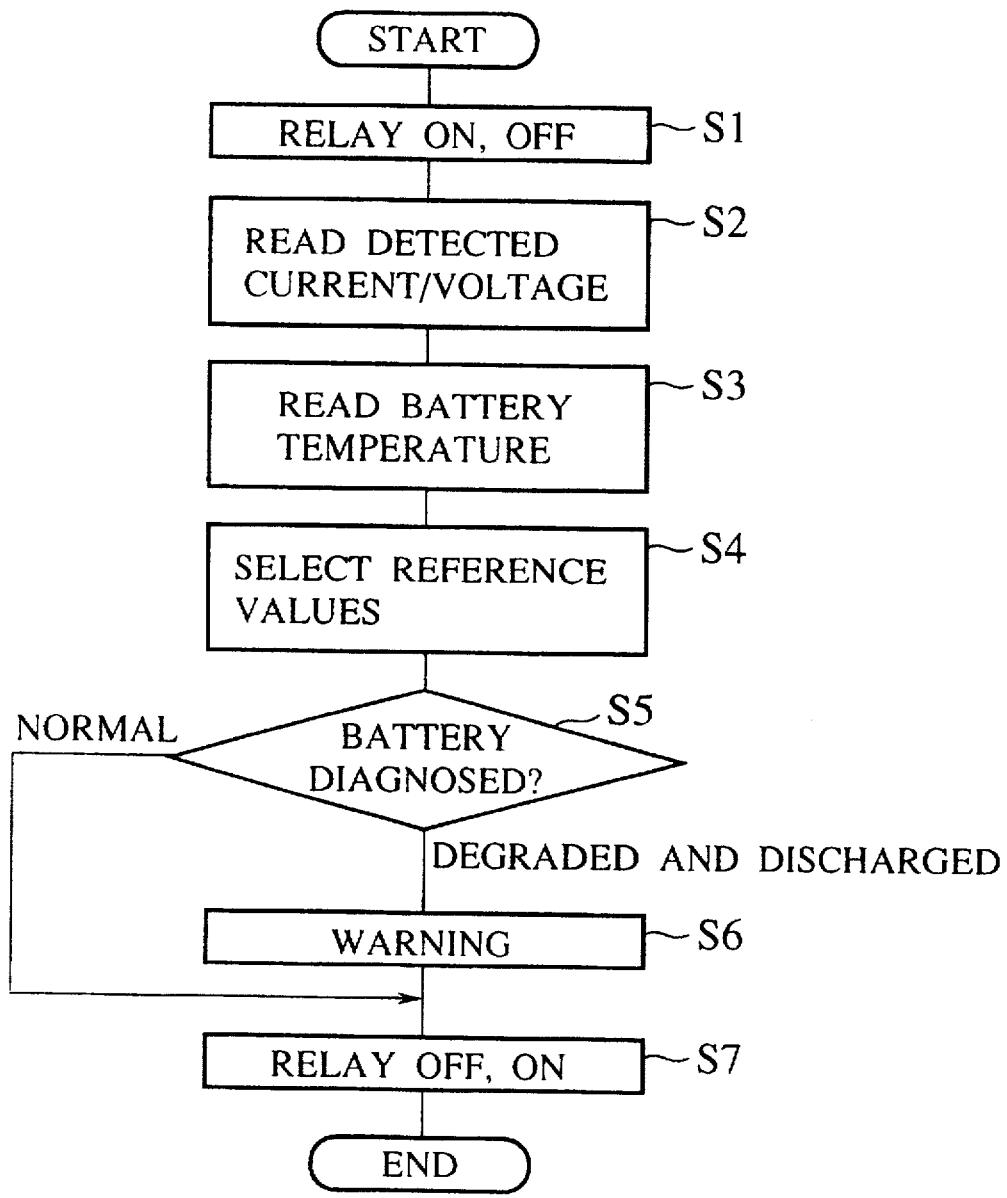
FIG. 9 is a flow chart of the operation of the second embodiment.

FIG. 9 is a flow chart for the second embodiment, which is substantially same as that of FIG. 5 but different in that only either the voltage or the electric current of the resistor 3 has to be detected in this embodiment. Additionally, at step S1, the battery flasher relay 27 is turned off and the resistor flasher relay 35 is turned on and, at step S7, the battery flasher relay 27 is turned on and the resistor flasher relay 35 is turned off.

Thus, with this embodiment again, the controller 23 can determine if the low voltage battery 1 has been degraded or not on the basis of the signal from the current/voltage sensor 25 by referring to the reference values (e.g., 10V or 7.2V) selected as a function of the temperature of the low voltage battery 1 as shown in FIGS. 7 and 8. Hence, this embodiment is as effective as the first embodiment. Additionally, this embodiment may have a wider applicability because of the provision of a resistor 33 as a resistor means.

Therefore, the driver of the automobile does not have to start without knowing the degraded state of the low voltage battery 1 to experience the uncomfortable feeling of seeing the brightness of the head lamps fluctuates, while maneuvering the automobile.

It should be understood that many modifications and adaptations of the invention will become apparent to those skilled in the art and it is intended to encompass such obvious modifications and changes in the scope of the claims appended hereto.

What is claimed is:

1. An apparatus for diagnosing a low voltage battery, comprising:

a high voltage battery for powering an electric automobile;

a voltage reducing means for reducing the output of the high voltage battery to a low voltage;

a low voltage battery for powering auxiliaries of the automobile, said low voltage battery being connected to said high voltage battery by way of said voltage reducing means;

a resistor means to be connected to said low voltage battery;

a current/voltage sensing means for detecting the electric currents and voltages of said low voltage battery and said resistor means;

a battery diagnosing means for diagnosing said low voltage battery at a start of operation of the automobile by referring to an output of the current/voltage sensing means and a set of selected predetermined reference values for diagnosis;

a battery switching means for interrupting the connection between said high voltage battery and said low voltage battery for the battery diagnosing means to diagnose; and a warning means operating according to a result of operation of the battery diagnosing means.

2. An apparatus for diagnosing a low voltage battery according to claim 1, wherein:

an internal resistance of a motor for driving a pump of the electric power steering system is used for the resistor means; and a pressure generating means is provided to generate a predetermined hydraulic pressure, when said battery diagnosing means diagnoses the low voltage battery, in an pump hydraulic circuit of said electric power steering system.

3. An apparatus for diagnosing a low voltage battery according to claim 2, wherein:

said battery diagnosing means diagnoses the low voltage battery according to an ON signal of an ignition switch of the automobile.

4. An apparatus for diagnosing a low voltage battery according to claim 3, wherein:

a temperature sensor is provided to detect a temperature of the low voltage battery; and said battery diagnosing means stores a plurality of sets of reference values to be selected depending on the temperature of the low voltage battery and diagnoses the low voltage battery by referring to the set of reference values selected for the detected temperature.

5. An apparatus for diagnosing a low voltage battery according to claim 2, wherein:

a temperature sensor is provided to detect a temperature of the low voltage battery; and said battery diagnosing means stores a plurality of sets of reference values to be selected depending on the temperature of the low voltage battery and diagnoses the low voltage battery by referring to the set of reference values selected for the detected temperature.

6. An apparatus for diagnosing a low voltage battery according to claim 1, wherein:

said resistor means is a resistor; and a resistor interrupting means is provided, and connects said low voltage battery with said resistor to establish a circuit only when said battery diagnosing means diagnoses the low voltage battery.

7. An apparatus for diagnosing a low voltage battery according to claim 3, wherein:

said battery diagnosing means diagnoses the low voltage battery according to an ON signal of an ignition switch of the automobile.

8. An apparatus for diagnosing a low voltage battery according to claim 7, wherein:

a temperature sensor is provided to detect a temperature of the low voltage battery; and said battery diagnosing means stores a plurality of sets of reference values to be selected depending on the temperature of the low voltage battery and diagnoses the low voltage battery by referring to the set of reference values selected for the detected temperature.

9. An apparatus for diagnosing a low voltage battery according to claim 6, wherein:

a temperature sensor is provided to detect a temperature of the low voltage battery; and said battery diagnosing means stores a plurality of sets of reference values to be selected depending on the temperature of the low voltage battery and diagnoses the low voltage battery by referring to the set of reference values selected for the detected temperature.

10. An apparatus for diagnosing a low voltage battery according to claim 1, wherein:

a temperature sensor is provided to detect a temperature of the low voltage battery; and said battery diagnosing means stores a plurality of sets of reference values to be selected depending on the temperature of the low voltage battery and diagnoses the low voltage battery by referring to the set of reference values selected for the detected temperature.

11. An apparatus for diagnosing a low voltage battery according to claim 1, wherein:

said warning means is a warning light.

12. An apparatus for diagnosing a low voltage battery comprising:

a high voltage battery for powering an electric automobile;

a voltage convertor that reduces the output of the high voltage battery to a low voltage;

a low voltage battery for powering auxiliaries of the automobile, said low voltage battery being connected to said high voltage battery through said voltage convertor;

a resistor connected to said low voltage battery;

a current/voltage sensor that detects an electric current and voltage of said low voltage battery and said resistor, respectively;

a controller that diagnoses said low voltage battery at a start of operation of the automobile by referring to an output of the current/voltage sensor and a set of selected predetermined reference values for the diagnosis;

a battery relay that interrupts the connection between said high voltage battery and said low voltage battery to allow diagnosis of said low voltage battery; and a warning indicator that alerts in accordance with a result of diagnosing said low voltage battery.

13. An apparatus according to claim 12, wherein said resistor includes an internal resistance of a motor that drives a pump of an electric power steering system of the automobile.

14. An apparatus according to claim 12, further comprising:

a resistor relay that connects said low voltage battery with said resistor to establish a circuit only during diagnosis of said low voltage battery.

15. An apparatus according to claim 12, further comprising:

a temperature sensor that detects a temperature of said low voltage battery, wherein said controller stores a plurality of sets of reference values to be selected depending on the temperature of the low voltage battery, and wherein said controller diagnoses said low voltage battery by referring to a set of reference values selected for the detected temperature.

16. An apparatus according to claim 12, wherein said warning indicator includes a warning light.

* * * * *